United States Patent
Hellberg

(10) Patent No.: US 8,015,225 B2
(45) Date of Patent: Sep. 6, 2011

(54) MULTI-STEP NON-LINEAR TIME-DISCRETE PROCESSING

(75) Inventor: Lars Richard Birger Hellberg, Huddinge (SE)

(73) Assignee: Telefonaktiebolaget L M Ericsson (Publ), Stockholm (SE)

(*) Notice: Subject to any disclaimer, the term of this patent is extended or adjusted under 35 U.S.C. 154(b) by 1112 days.

(21) Appl. No.: 11/722,260

(22) PCT Filed: Dec. 21, 2004

(86) PCT No.: PCT/SE2004/001991
§ 371 (c)(1),
(2), (4) Date: Jun. 20, 2007

(87) PCT Pub. No.: WO2006/068554
PCT Pub. Date: Jun. 29, 2006

(65) Prior Publication Data
US 2008/0133183 A1    Jun. 5, 2008

(51) Int. Cl.
*G06F 17/10*    (2006.01)
(52) U.S. Cl. ..................................................... 708/304
(58) Field of Classification Search ........... 708/300–323
See application file for complete search history.

(56) References Cited

U.S. PATENT DOCUMENTS 4,761,752 A * 8/1988 Barnes .......................... 708/422
5,812,608 A * 9/1998 Valimaki et al. ............... 708/313

OTHER PUBLICATIONS

T. Laakso et al., "Splitting the unit delay", IEEE Signal Processing Magazine, Jan. 1996.

* cited by examiner

*Primary Examiner* — Tan V Mai
(74) *Attorney, Agent, or Firm* — Roger S. Burleigh

(57) ABSTRACT

A non-linear processing device (1) is presented, in which fractional-delay filtering (20)—fractional as compared with a sample rate used in the processing steps—is used between successive processing steps (10). A corresponding method is also presented. The fractional delay (20) exposes the signal in-between the original samples to the non-linear processing (30, 40). A lower sample rate or a higher signal quality can thus be achieved. The so-called fractional sample delays are preferably chosen differently for different systems depending on bandwidths, number of channels, number of non-linear processing steps (10) and other varying factors. The multi-step non-linear processing (10) concept of the invention is preferably used within a cascade of non-linear modifications and/or filtering steps (10).

18 Claims, 8 Drawing Sheets

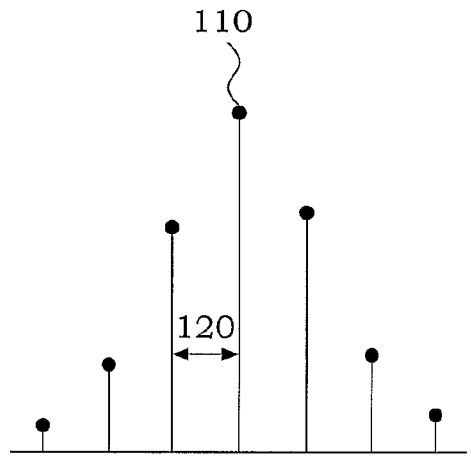
Fig. 2A
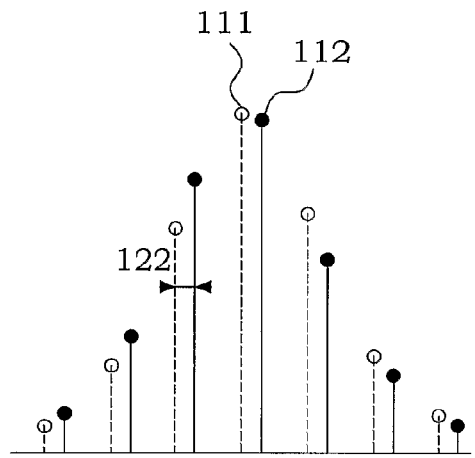
Fig. 2B
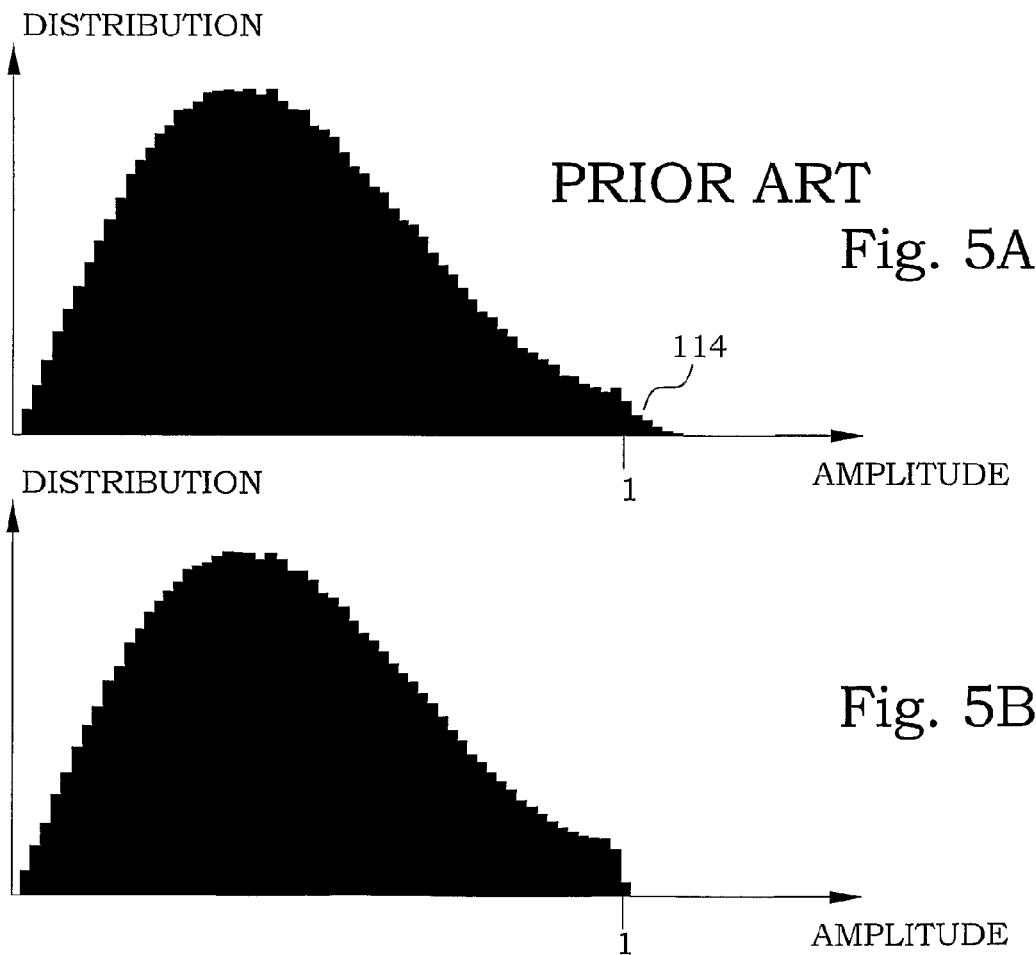
PRIOR ART
Fig. 5A
Fig. 5B

US 8,015,225 B2

MULTI-STEP NON-LINEAR TIME-DISCRETE PROCESSING

TECHNICAL FIELD

The present invention relates in general to devices and methods for non-linear time-discrete processing, and in particular to such processing being performed in more than one processing step, cascaded after each other.

BACKGROUND

In many systems, there is a need to process a signal non-linearly, so that the signal stays within certain (constant or signal-dependent) boundaries. It is often desirable that the signal also is kept within a certain bandwidth. In particular in radio signal applications, this ensures that it does not spill over into adjacent channels or exceeds spectral emission limits.

When non-linear processing and filtering force a time-discrete signal to stay within certain boundaries, this can generally only be guaranteed at the sample instants. As the time-discrete signal is converted into time-continuous form, or upsampled to a higher sampling rate, it will typically exhibit overshoots that go outside the set boundaries, sometimes far outside. Generally, lower oversampling ratio (OSR) and sharper non-linear processing give rise to larger overshoots that are seen after upsampling or conversion to time-continuous form.

The traditional solution to this problem is to perform the non-linear/filter processing at a sufficiently high rate from the start. The problem with such solution is that processing at a higher sample rate (higher OSR) costs more in terms of operations per second, amount of hardware, or power consumption.

SUMMARY

A general problem with prior art is that a high sample rate is needed in order to counteract signal artefacts when time-discrete signals are converted into continuous signals. This in turn requires more computational power, more hardware and consumes more power.

A general object of the present invention is thus to provide non-linear time-discrete processing having less tendency to produce artefact signals. Another object in analogy with this is to provide non-linear time-discrete processing needing less sample rate to produce the same signal quality. A subordinated object is to provide non-linear time-discrete processing requiring less total amount of hardware.

The above objects are achieved by methods and devices according to the enclosed claims. In general, the present invention uses fractional-delay filtering in between successive processing steps, fractional as compared with a sample rate used in the steps, to expose the signal in-between the original samples to the non-linear processing. A lower sample rate or a higher signal quality can thus be achieved. The basic idea is to delay the signal by a fraction of a sample in or between each step, so that signal samples used in a later step are placed in-between the sample instants used in a previous step. The so-called fractional sample delays are preferably chosen differently for different systems depending on bandwidths, number of channels, number of non-linear processing steps and other varying factors. The multi-step non-linear processing concept of the invention is preferably used within a cascade of non-linear modifications and/or filtering steps.

The invention is a solution that can be applied generally to many problems in communications and other systems, especially multi-carrier and multi-user systems.

This multi-phase non-linear processing makes it possible to use a low OSR, which results in a low number of operations per second, reduced hardware requirements, and reduced power consumption. Alternatively, when using the same OSR, the quality of the resulting signal becomes higher.

BRIEF DESCRIPTION OF THE DRAWINGS

The invention, together with further objects and advantages thereof, may best be understood by making reference to the following description taken together with the accompanying drawings, in which:

FIGS. 2A-B are diagrams illustrating sample phases in two successive steps in an embodiment of the present invention;

FIG. 5A is a diagram illustrating an amplitude distribution resulting from an embodiment of a prior art system;

FIG. 5B is a diagram illustrating an amplitude distribution resulting from an embodiment of a system according to the present invention;

DETAILED DESCRIPTION

Figures 1A, 1B:
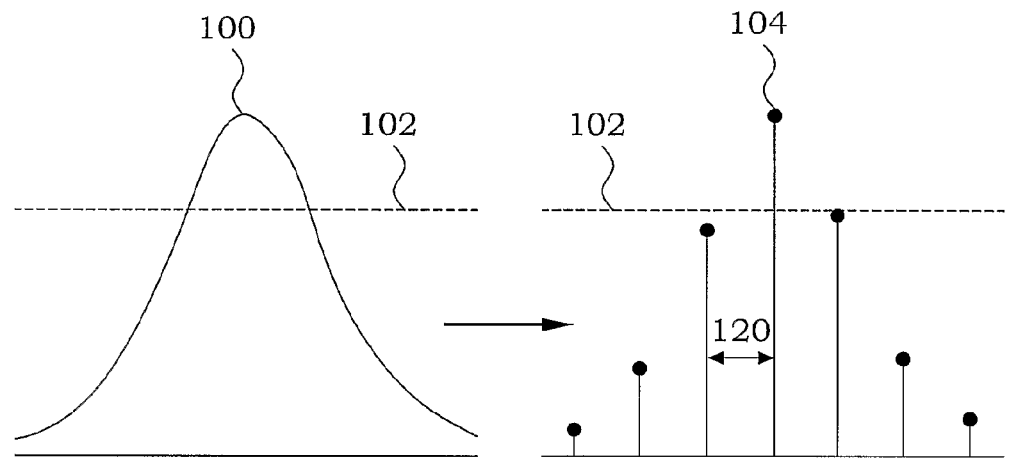
FIGS. 1A-D illustrates an example of a prior art non-linear time-discrete signal processing and artefacts produced thereby.
Figures 1C, 1D:
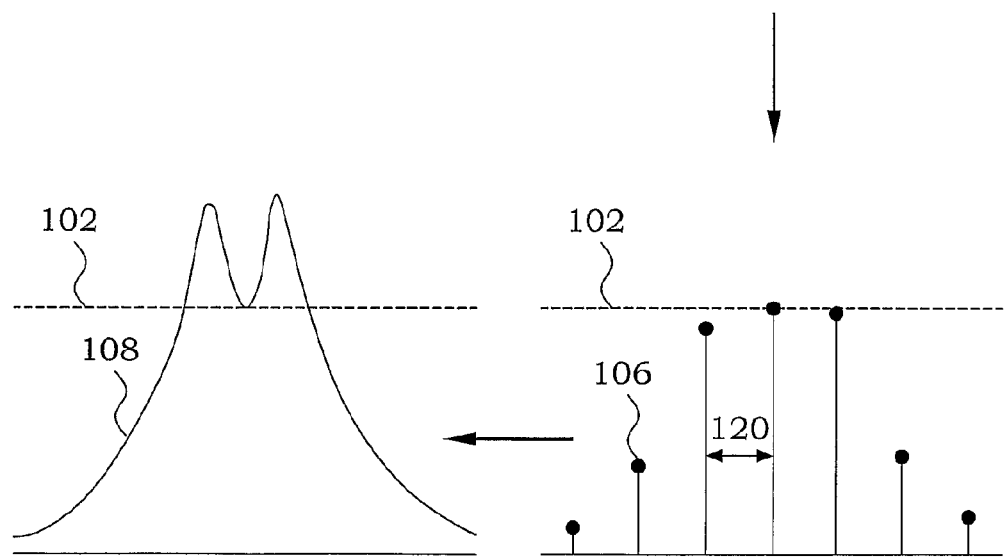

In FIGS. 1A-D, diagrams are illustrating an example of the effect of a prior art non-linear signal modification on time-discrete signals. In FIG. 1A, a continuous signal 100 is received. One wants to modify the signal 100 to stay below the threshold amplitude, indicated by the broken line 102. This is for reducing the peak-to-average ratio, and is a typical example of a non-linear signal modification. The signal modification is here assumed to be performed digitally, i.e. with a time-discrete representation of the continuous signal 102. Such a signal is thus digitised, using a certain sample rate. The sample rate is inversely proportional to an intersample spacing or time difference between samples 120. A larger intersample spacing corresponds to a lower sample rate and vice versa. In FIG. 1B, the signal is now digitised, being represented by a set of time-discrete values 104. A digital non-linear signal modification is performed on the time-discrete signal to remove the part of the signal exceeding the threshold 102. The result is illustrated in FIG. 1C. The modified signal is now represented by a modified set of values 106. The digital non-linear processing ensures that the requirements put on the non-linear modification, in this case the requirement that the signal should be kept under the threshold 102, are met at least at the time-instances of the values 106, i.e. at the sample points. However, when making a continuous or upsampled signal from the modified set of time-discrete values 106, a result such as the curve 108 in FIG. 1D may be the result. The requirements are still valid at the sample points of the digital non-linear processing, but may exhibit large discrepancies between these sample points.

Such an effect is known in prior art and is typically solved by increasing the sample rate, i.e. introduce more samples in-between the original values from the beginning. However, such increased oversampling rate will also increase the computational complexity, the hardware requirements and the power consumption.

In a system, where the time-discrete non-linear signal processing is performed in a number of successive steps, the present invention can be applied. In a first processing step, time-discrete samples, as indicated by the points 110 in FIG. 2A are used as input values. These time-discrete samples have a certain sample rate and thus a certain intersample spacing 120. The result of the first step ensures that the limitation requirements are met at the sample points. However, when inputting the modified samples from the first step to a second step, the samples are modified according to the present invention. FIG. 2B illustrates such a situation. The samples 111 indicated by circles in FIG. 2B represent the modified signal at the output of the first step. The samples are positioned at the same time positions as at the samples of the input to the first step (or shifted an integer number of sample times). According to the present invention, the input signal to the second step should instead comprise samples 112, indicated by filled circles that are positioned in time between the samples input to the first step. Instead of moving the signal samples an integer number of sample times, a "fractional" delay is introduced between the steps, resulting in samples at times that do not coincide with the times for the samples in a preceding step.

A non-linear signal modification in the second step will now modify the signal at sample points different from the sample points where modification was performed in the preceding step. The worst cases of artefacts when returning to a continuous signal will in such a way be avoided. In particular when even more steps are included, and all steps are treating samples positioned at different time positions, the risk for artefacts will be significantly reduced.

Figure 3:
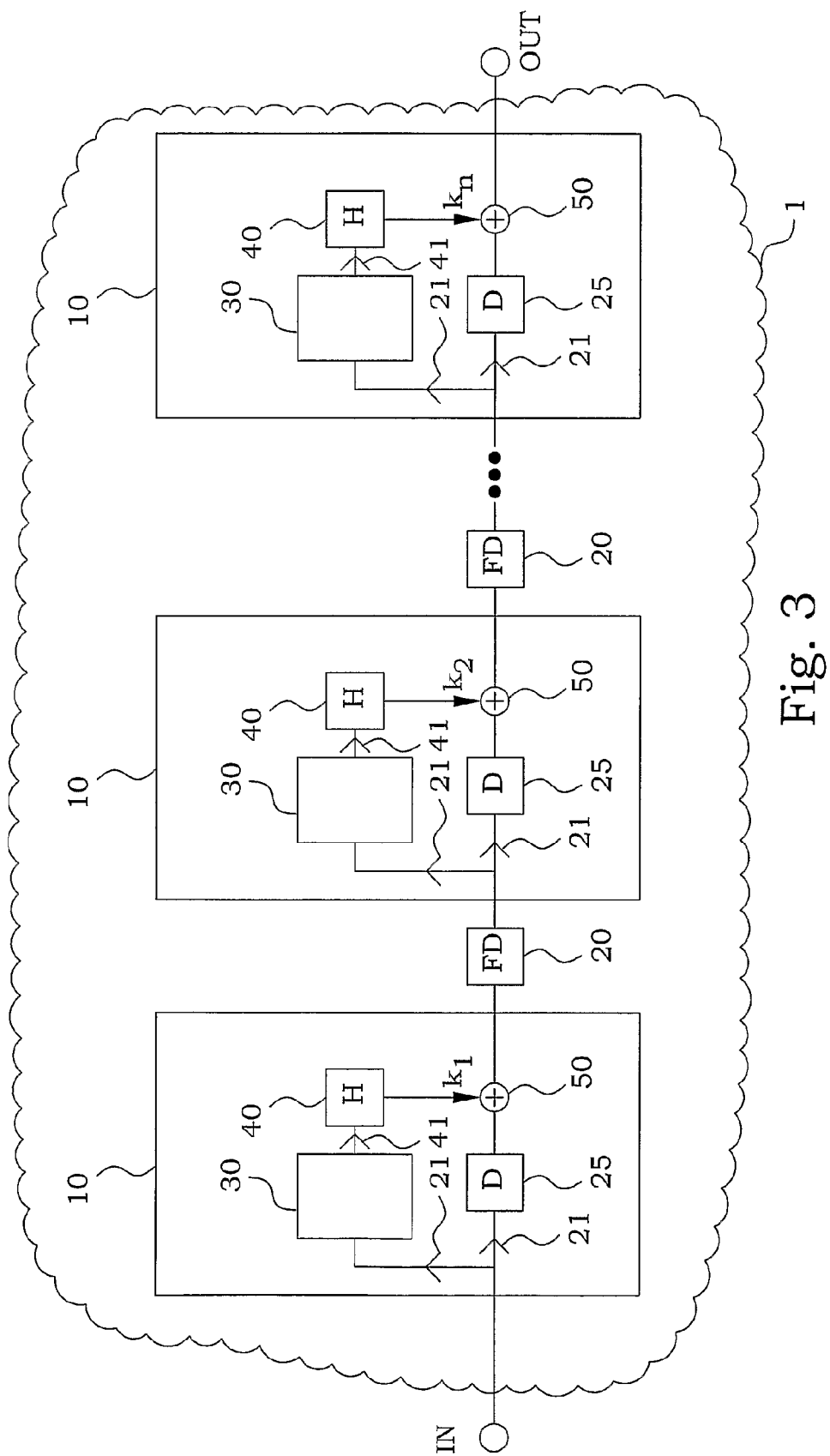
FIG. 3 is a block scheme of an embodiment of a multi-step non-linear processing device according to the present invention.

FIG. 3 illustrates a block scheme of an embodiment of a non-linear digital signal modification device 1 according to the present invention. An input digital signal is received at an input IN. The input digital signal is processed through a series of cascaded processing steps 10. Each step 10 performs a non-linear processing of the input signal and produces a modified output signal. A subsequent step 10 has thus the output signal of a preceding step, in certain embodiments delayed, as input signal. The steps 10 may be similar or identical in configuration, but this is not entirely necessary. The present invention operates also in systems where one or several processing steps may be completely different in configuration.

In the present embodiment, an input signal 21 of a step 10 is connected to a non-linear digital processor 30. The non-linear digital processor 30 produces an insertion digital signal 41 that represents a discrepancy signal between the input signal 21 and a target signal. The insertion digital signal 41 is in a general case not bandwidth restricted. The insertion digital signal 41 is in the present embodiment connected to a bandwidth reducing filter 40 in order to modify the insertion digital signal 41 as to comply with bandwidth restrictions. The bandwidth restricted insertion digital signal is combined with the input signal in an adder 50 to produce an output signal from the processor step 10. Typically, the non-linear digital processor 30 and the bandwidth reducing filter 40 takes some time for processing the signals. A delay means 25 is therefore inserted between the input of the processor step and the adder 50 in order to synchronise the input signal 21 and the bandwidth restricted insertion digital signal.

According to the present invention, a fractional delay filter 20 is connected between the output of a preceding processor step and the input of a subsequent processor step. The subsequent processor step will in the present embodiment perform a similar processing as in the first step, but now with sample points located between the positions of the sample points of the first step. After performing n steps of processing, the output signal from the last processor step is presented as the output signal of the non-linear digital signal modification device 1 at an output OUT.

In a conventionally influenced embodiment, the combination of the bandwidth restricted insertion digital signal and the input signal is performed using a unity insertion factor $k_1$-$k_n$ for the bandwidth restricted insertion digital signal. However, by using non-unity insertion factors $k_1$-$k_n$, and in particular continuously increasing insertion factors $k_1$-$k_n$, improved convergence behaviour may be obtained.

In the embodiment of FIG. 3, the introduction of a fractional delay takes place "between" the processor steps 10. However, an important feature of the present invention is that there is a fractional delay difference between corresponding parts of two successive processing steps, e.g. between the inputs of two successive processing steps. The non-linear processing will thereby be performed at sample points differing in time. The actual place where the fractional delay is introduced is, however, of minor importance. There is usually a delay of several samples (apart from the fraction of a sample suggested by the name) in a practical fractional delay filter. This increases the latency of the implementation of the algorithm, which can be detrimental in some cases. As a solution to this latency problem, the fractional delays can be incorporated into the filters and delays of the original implementation.

Figure 4:
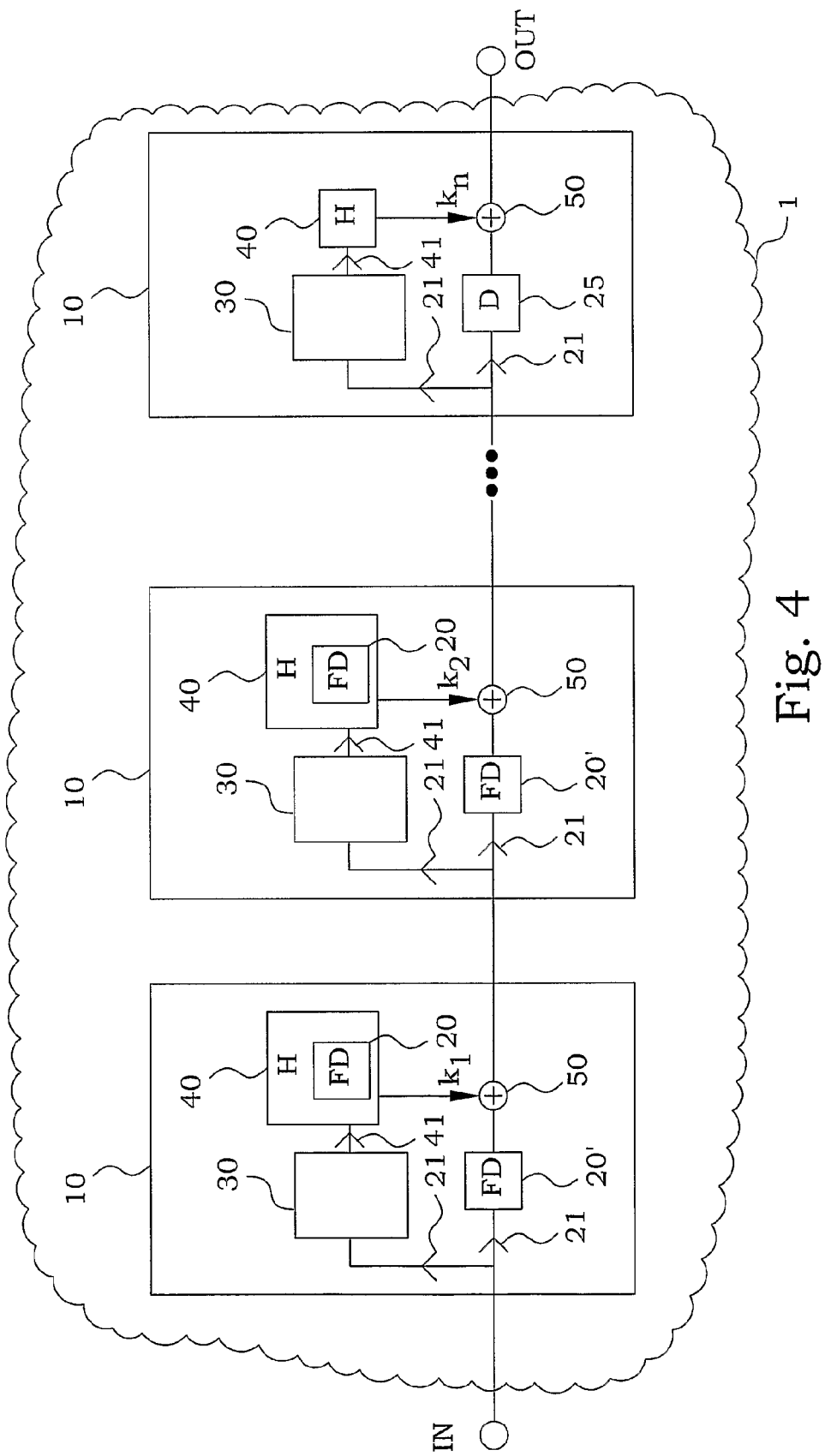
FIG. 4 is a block scheme of another embodiment of a multi-step non-linear processing device according to the present invention.

An embodiment of a non-linear digital signal modification device 1 having fractional delay implicitly in the processing steps is illustrated in FIG. 4. In a step 10, the input signal 21 is as in earlier embodiment non-linearly processed in the non-linear digital processor 30. However, here the filter 40 comprises a fractional delay 20, so that the signal that is to be combined with the input signal has sample points which differ from the input signal 21. To compensate for this, the delay means 25 in the previous embodiment is exchanged to a fractional delay filters 20', synchronising the input signal 21 to the fractional delayed output from the filter 40. The fractional delay filters 20' need to have the same integer and fractional delay as the entire filter 40, including the fractional delay 20, plus delays in the non-linear processing means 30. The filters 40 must thereby be designed to give fractional delays to the signal in addition to correct filtering. Usually this is easy and does not add much to the length (number of taps) of the filters. However, it will often give asymmetric filters, which need more multipliers for the same number of taps.

Even if the output from the stage occurs with a signal having fractional delayed sample points, the actual non-linear processing was performed at the original sample points. The next step will, however, perform the non-linear processing at the fractional delayed sample points.

Integer delays have no frequency dependence, except for trivial linear phase. Fractional delays, on the other hand, cannot be perfect across all frequencies. They have frequency dependent delay or frequency dependent amplitude response, or both, in varying degrees depending on implementation complexity. Generally, these filters should therefore be optimised for low delay ripple and amplitude ripple in the parts of the spectrum that the signals occupy.

An example of a sequence of fractional delays, that can be used for two 25 MHz wide channels with Rayleigh amplitude statistics, multi-carrier or multi-user scenario, separated by 50 MHz processed at a complex sampling rate of 150 MHz, is: $\frac{1}{4}, \frac{1}{4}, \frac{1}{4}, -\frac{3}{8}, -\frac{1}{4}, -\frac{1}{4}, -\frac{1}{4}, \frac{3}{8}$ (samples). The delays can be optimised to specific applications by hand or by computer simulation.

If the non-linear digital processors 30 in FIGS. 3 & 4 are arranged as peak extractors and the combining of the processed signal and the input signal takes place with a minus sign, the non-linear digital signal modification device 1 operates as a Peak-to-average ratio (PAR) reduction device. PAR reduction is also known as decresting or clipping. PAR reduction increases efficiency and average output power of a Power Amplifier (PA). The objective is to reduce the peak amplitude excursions of the output signal while keeping the spectrum expansion within specified limits in terms of spectral mask and adjacent channel power ratio (ACPR) specifications. At the same time in-band errors should be kept within specified limits, e.g. error vector magnitude (EVM) specifications. In the embodiment of FIG. 3, operating as a PAR reduction device, the peak extractor 30 extracts the part of the input signal 21 that exceeds a certain amplitude threshold T. In other words, in PAR reduction, the boundary used in the non-linear processing is generally constant and is only applied to the amplitude part of the signal. The boundary thereby spans a circle in the complex plane. The filter 40 ensures that the extracted signal stays within bandwidth requirements and the filtered signal is then subtracted from the (delayed) input signal at the combiner 50.

A model system comprising a Peak-to-Average Ratio (PAR) reduction system was used for simulating the results of the present invention. A typical signal distribution was introduced and an amplitude threshold was set at a relative amplitude of 1. A prior art system with a specific sampling rate was used to filter the signals non-linearly in order to remove the peaks of the signals exceeding the amplitude of 1. The result was then upsampled with a large factor in order to simulate a conversion into a continuous signal. The result is shown in a diagram of FIG. 5A. The PAR reduction did indeed move some of the distribution originally appearing above amplitude 1, which can be seen as a small "bump" just below the amplitude 1. However, as anyone can see, despite the prior art PAR reduction, there is a "tail" 114 extending upwards from the amplitude of 1. The tail is due to overshoots that got past the peak extractor since they occurred in-between the samples at the (low) processing rate, before upsampling.

The same procedure was repeated with a system according to the present invention. The results are illustrated in a diagram in FIG. 5B. Here, the tail is almost completely gone, which means that the PAR of the output signal is significantly lower by the use of the invention.

The present invention can advantageously be applied to a number of different systems. In many of such systems, the non-linear modifications are usually put in the form of forcing a signal to stay within a boundary that can be constant or signal-dependent. The boundary can be one-sided or many-sided or be applied on the amplitude or phase part of a polar signal. As discussed above, in PAR reduction, the boundary is generally constant and only applied to the amplitude part of the signal. In an envelope elimination and restoration (EER)-like amplifier arrangement, the boundary is typically signal-amplitude dependent and one-sided. In applications with signal-dependent boundaries for the non-linear processing, such as EER, a reference signal must be provided along with the processed signal. The reference signal must then have the same delay, including fractional sample delays, in each step, as the processed signal.

Figure 6:
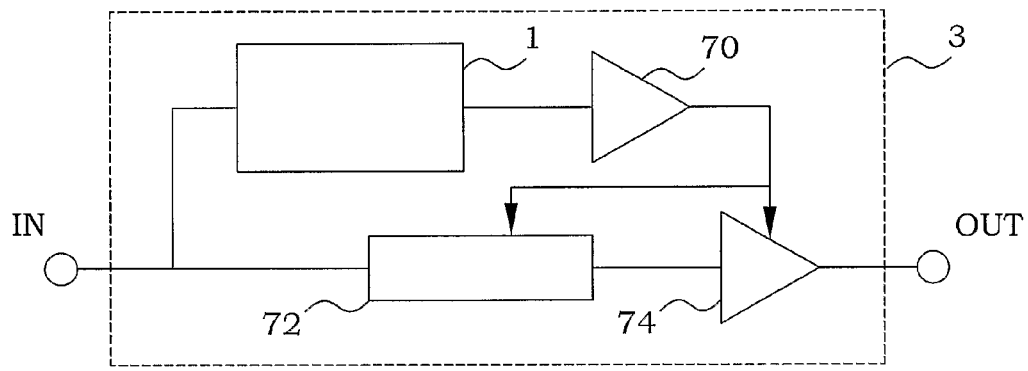
FIG. 6 is a block diagram of an embodiment of an arrangement of a dynamic drain bias amplifier type, in which the present invention can be applied.

An embodiment of a generator system 3 of an EER type is illustrated in FIG. 6. The objective of the system is to keep the drain terminal voltage of a PA 74 as little above the minimum needed, which is largely proportional to the envelope of the amplified signal, to maximise efficiency, while restricting its bandwidth. A lower bandwidth gives increased efficiency in a drain voltage amplifier 70, which usually is a switch-mode amplifier. The drain voltage is generated by a non-linear processing unit 1, preferably arranged according to the principles of the present invention. The non-linear processing unit 1 is connected to the input signal and produces a drain voltage that is dependent on the envelope of the input signal. A dynamic modulator 72 adjusts the input signal according to the obtained drain voltage, in order to give an output voltage that is a linear amplification of the input voltage.

Figure 7:
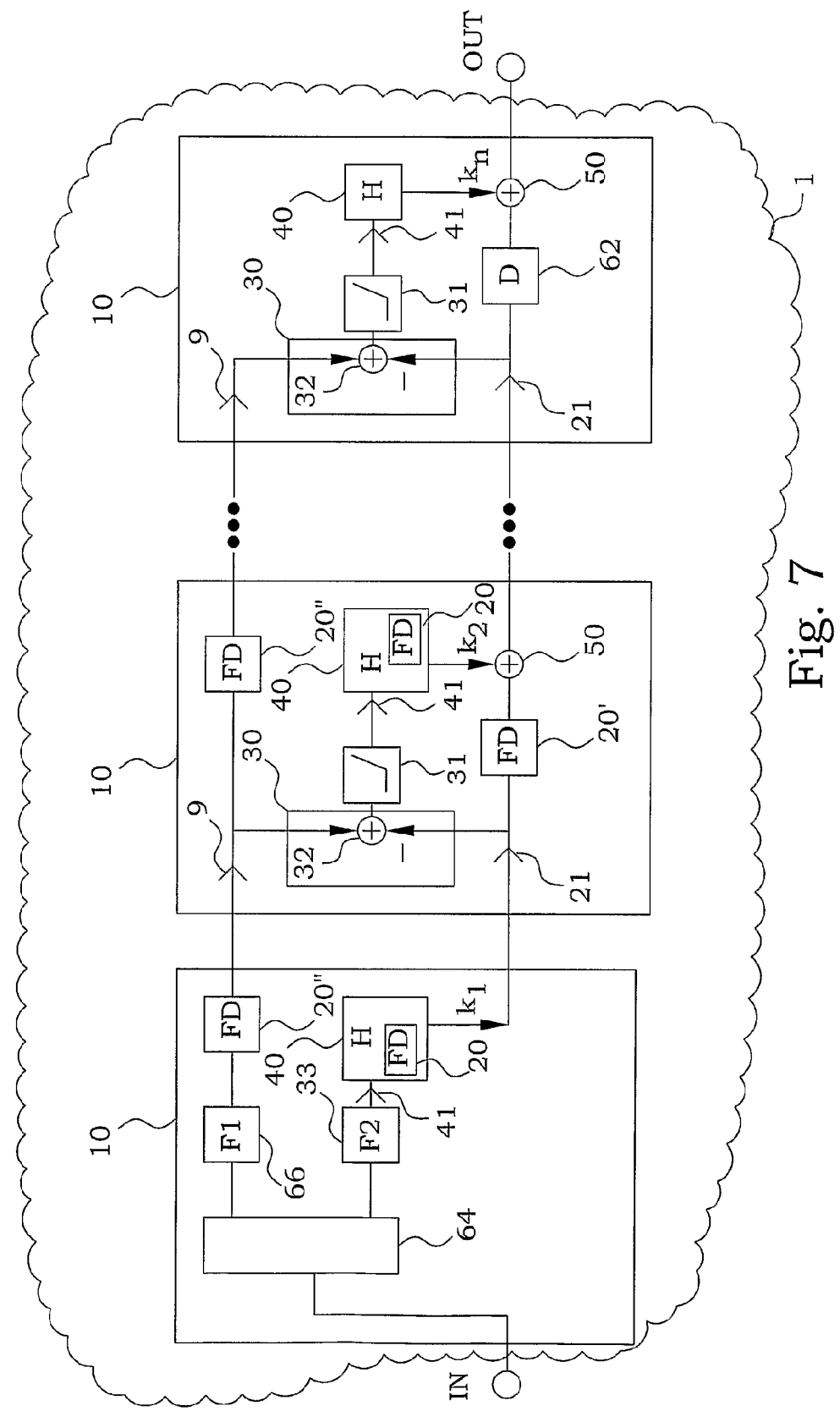
FIG. 7 is a block diagram of an envelope detector of the amplifier arrangement of FIG. 6.

An embodiment of a non-linear processing unit 1, suitable for the generator system 3 of FIG. 6, is illustrated in FIG. 7. This non-linear filter 1 is based on a multi-stage approach suitable for implementing fractional delay. An input signal is provided from an input IN to an envelope detector 64, which extracts an envelope of the input signal. The envelope signal is connected to a processing unit 66, which generates a reference signal. This reference signal is the ideal signal if there would be no bandwidths concerns. Typically, this reference signal is equal to or close to a linear function of the envelope. However, in a general case, the reference signal can be any function F1 of the envelope signal.

The envelope signal is also provided to another processing unit 33, which generates a seed signal 41 for the process of obtaining a supply voltage. The processing unit 33 in the present embodiment gives a seed signal that is a function F2 of the envelope signal. In order to further restrict the bandwidth within allowed ranges, the seed signal is connected to a low-pass filter 40, giving a seed signal of appropriate bandwidth as input to a next step of the non-linear processing unit 1.

According to the present invention, the signal forwarded to the next step of processing experiences a fractional delay. In the present embodiment, such fractional delay 20 is comprised in the filter 40. The reference signal also has to be delayed in a fractional delay unit 20' in a corresponding manner in order to synchronise the reference signal and the seed signal at the input to the next stage. The fractional delay unit 20'' thus also compensates for any other delay discrepancies between the two signal branches.

The non-linear processing unit 1 of FIG. 7 further comprises a number of further non-linear signal processing steps 10. In this embodiment, the steps are essentially identical, except for a reinsertion factor further described below. The reference signal 9 and the seed signal 21 are provided to a means 30 for providing an insertion signal. A subtractor 32 is connected to the reference signal 9 and the seed signal 21, providing the difference there between. The subtractor 32 can e.g. be implemented as in FIG. 7 as an adder of a negative seed signal 21. The difference is subsequently rectified in a rectifier 31, extracting the positive parts of the difference signals, to produce the insertion signal 41. This insertion signal 41 represents the addition to the seed signal 21, that would give an output signal having no undershoots at all. However, the raw insertion signal 41 does not comply with bandwidth constraints. Therefore, the insertion signal 41 is connected to a filter 40, reducing the bandwidth into the allowed range. The filter 40 is typically a low-pass filter. The filters in the different stages are typically similar but not necessarily exactly identical. According to an embodiment of the present invention, the filter 40 also comprises a fractional delay 20. The bandwidth-reduced insertion signal is then combined with the input signal 21 to the stage 10 delayed by a fractional delay means 20', in order to compensate for any delays in the subtractor 32, the rectifier 31, and/or the filter 40. In this embodiment, the bandwidth reduced insertion signal is added to the stage input signal 21 using a certain reinsertion factor, which will be discussed more in detail further below. The output signal from one step is connected as an input signal 21 to a next step in the cascade of steps, as indicated by the dots in FIG. 7. Also the reference signal 9 is connected to the next step, delayed by a fractional delay means 20" in order to be in phase with the input signal 21.

The reinsertion factors, $k_1$ to $k_n$, can be set to one, given that the rectifiers and filters have unity gain. However, in a general method for improving iterated non-linearity/filter algorithms they can be allowed to increase for each stage, with the first one preferably set to one. With the reinsertion factors properly selected, this leads to a substantial reduction in the number of stages needed for a given level of quality or efficiency. Generally, more stages give better quality, since the band-limited envelope signal then stays better out of regions of inefficiency and low output quality and thus requires less safety margin.

Figure 8:
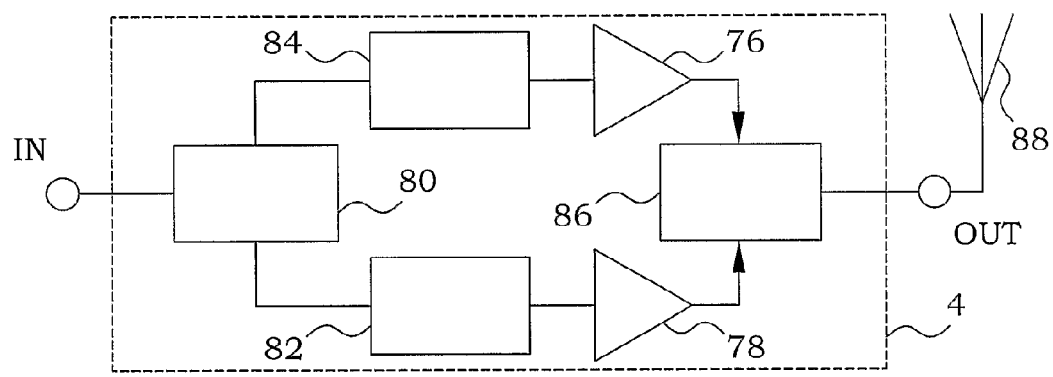
FIG. 8 is a block diagram of an embodiment of a Chireix PA arrangement in which the present invention can be applied.

The present invention can also be applied to composite amplifier systems, such as Doherty or Chireix PA systems. An embodiment of a Chireix PA arrangement 4 is illustrated in FIG. 8. An input signal is connected to two power amplifiers 76, 78 via a control network. The control network of a Chireix amplifier 4 typically comprises a signal component separator 80, producing phase-modulated constant-amplitude signals. These signals are upconverted in upconverters 82, 84, before being amplified in the power amplifiers 76, 78. A combiner network 86 combines the individual amplified signals into an output signal, provided to a load output, in this example connected to an antenna 88. The phases of these constant-amplitude signals are chosen so that the result from their vector-summation in the Chireix combiner network 86 yields the desired amplitude. All amplitudes from zero to full amplitude, as well as negative amplitudes, can be obtained in this way. The flattened voltages at the amplifier drain terminals should exhibit minimal overshoots. Non-linear amplifier signals that fulfil this condition and stays within a limited bandwidth, and further increase efficiency, can be manufactured by using a processing similar to that used in PAR reduction above.

Figure 9:
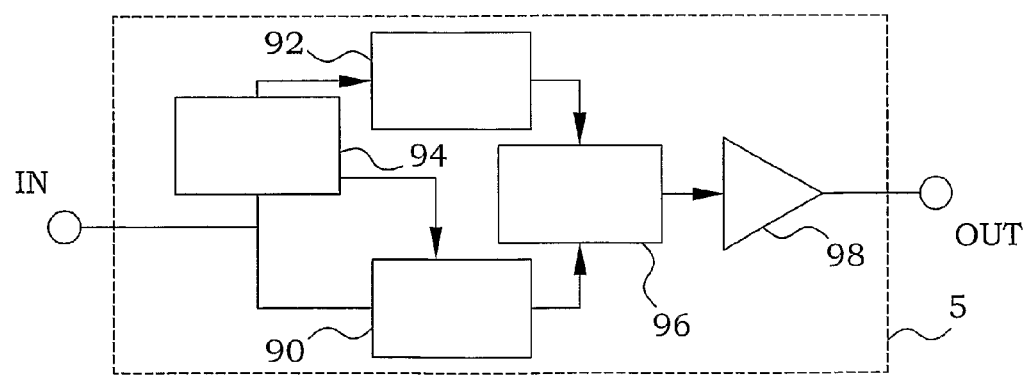
FIG. 9 is a block diagram of an embodiment of a dynamic gate bias PA arrangement in which the present invention can be applied.

The present invention can also be used to increase efficiency in Dynamic Gate Bias systems. FIG. 9 illustrates one embodiment of a Dynamic Gate Bias system 5. An input signal provided to the system 5 is intended to be amplified and provided as a radio frequency output signal. The input signal is connected to an input detector 94, which is arranged to determine an instantaneous (envelope) size measure of the input signal. An output of the input detector 94 is connected to a bias signal generator 92, which generates a bias signal to be used for providing the actual amplification operation. The bias signal generator 92 can thus provide a bias signal dependent on the input signal. The bias signal generator typically also comprises a bias amplifier. A signal dependent on the input signal is provided as a drive signal. The drive signal and the bias signal are matched in a matching unit 96 and provided to an amplifier 98, e.g. a power transistor, performing the actual amplification according to the selected drive signal and bias signal. A pre-distortion unit 90 is connected to the input signal and an output of the input detector for enabling a suitable pre-distortion of the input signal, typically for providing a linear output signal. An output signal is thus provided. By selecting the pre-distortion and the bias in an appropriate manner dependent on the size of the input signal, an efficient amplification can be achieved.

The ideal gate bias to a power transistor 98 is generally a non-monotonous function of the input amplitude. Limitations in the driver amplifier's output power gives a strict boundary to the bias function, and bandwidth limitations in the bias generating and amplifying circuits put restrictions also on the bandwidth. By applying and modifying the techniques used for dynamic drain bias systems (FIGS. 6-7), the bias signal generator 92 can provide signals giving a more efficient amplification.

Also here, starting with a seed signal that is a function, F2, of the input signal can be beneficial in the dynamic gate bias application.

Figure 10:
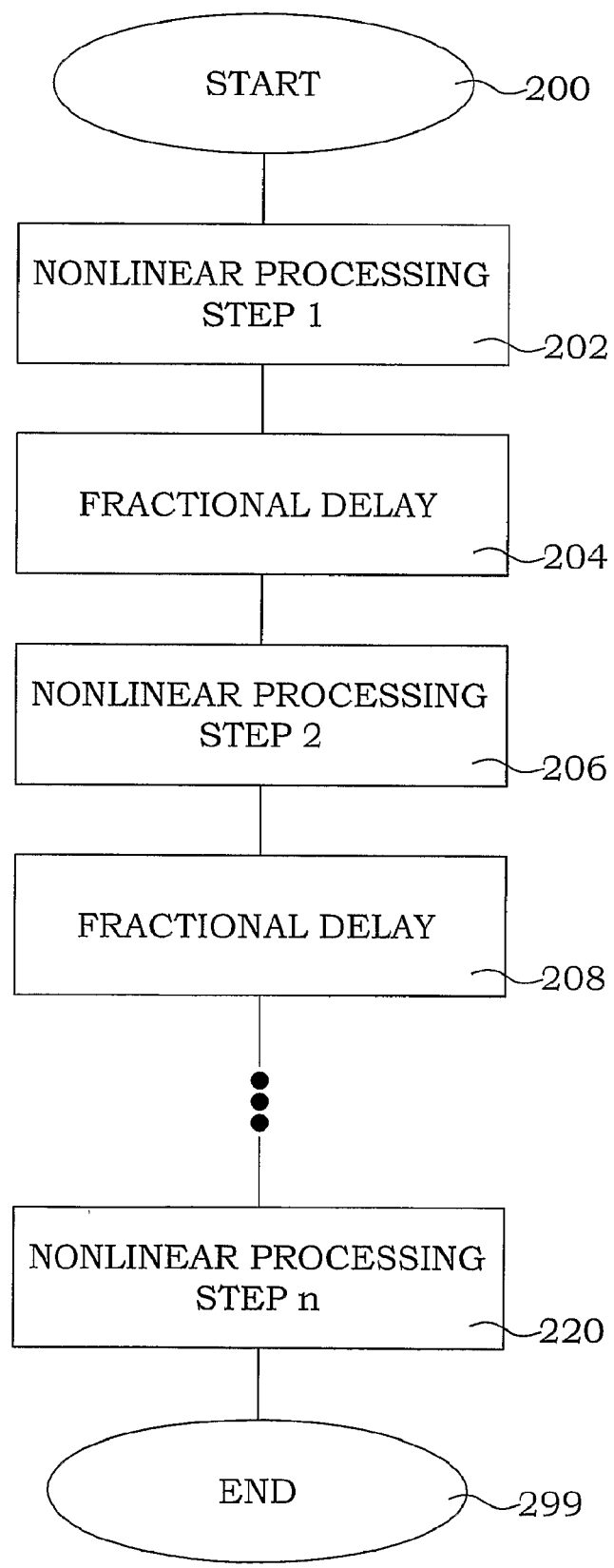
FIG. 10 is a flow diagram of the main steps of an embodiment of a method according to the present invention.

FIG. 10 illustrates a flow diagram of an embodiment of a method according to the present invention employing non-linear processing of signals in consecutive steps. The method starts in section 200. In section 202, a first process step is performed. In section 204, a fractional delay is introduced. In section 206, a second process step is performed using the fractional delayed signal. In section 208, another fractional delay is introduced. The process continues until a last process step, step n, is performed in section 220. The method ends in section 299.

Figure 11:
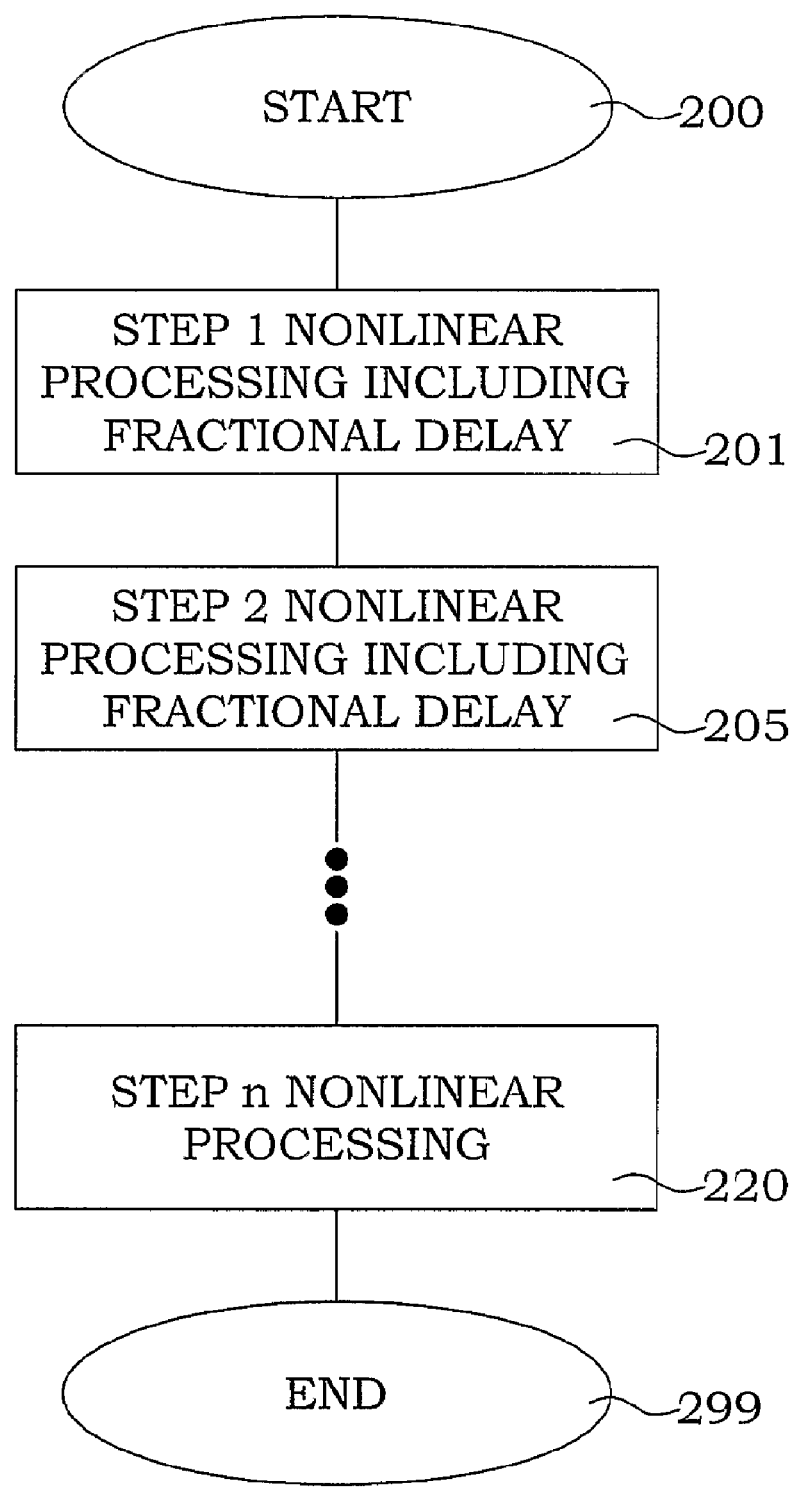
FIG. 11 is a flow diagram of the main steps of another embodiment of a method according to the present invention.

FIG. 11 illustrates a flow diagram of another embodiment of a method according to the present invention employing non-linear processing of signals in consecutive steps. The method starts in section 200. In section 201, a first process step is performed, which includes a fractional delay of the resulting signal. In section 205, a second process step is performed using the fractional delayed signal and which itself includes another fractional delay of the resulting signal. The process continues until a last process step, step n, is performed in section 220. The method ends in section 299.

With the invention, boundary-limited non-linear modifications of a time-discrete signal can be performed at substantially lower oversampling ratio (OSR) than with previous solutions. Lower OSR means that fewer computations are needed to perform the same task.

The main advantage is a large reduction in computational cost. A reduction in the sample rate by a factor of four is typical. Extra steps of processing may be needed, but this increase is generally in the order of less than two, which means that the required processing power is generally more than halved by the invention. The invention is a comparatively simple extension of the basic implementation of cascaded non-linearity/filtering that produces surprisingly good results.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

REFERENCES

T. Laakso et al., "Splitting the unit delay", IEEE Signal Processing Magazine, January 1996.

The invention claimed is:

1. A method in a communications device for non-linear processing of time-discrete signals at a sample rate, using a multitude of successive processing steps, comprising the steps of:
    applying fractional sample delay for at least one of said successive processing steps relative to a preceding one of said successive processing steps; and,
    applying fractional sample delay for all said successive processing steps relative to a preceding one of said successive processing steps, if any.

2. The method according to claim 1, wherein the fractional sample delay is applied between successive processing steps.

3. The method according to claim 1, wherein the fractional sample delay is applied within a processing step.

4. The method according to claim 3, wherein the fractional sample delay is applied integrated with a filtering process.

5. The method for peak-to-average ratio reduction, comprising a method according to claim 1 to produce a digital signal with reduced peak-to-average ratio.

6. The method for Doherty or Chireix type amplification, comprising a method according to claim 1 to produce drain signals.

7. The method for dynamic gate bias amplification, comprising a method according to claim 1 to provide at least one of a gate bias signal and a pre-distorted input signal.

8. The method according to claim 7, wherein the fractional sample delay is applied also on a reference signal.

9. The method for dynamic drain bias amplification, comprising a method according to claim 1 to provide a supply voltage from an envelope signal.

10. A communications device for non-linear processing of time-discrete signals at a sample rate, having a multitude of successive processing steps, comprising:
    means for applying fractional sample delay for at least one of said successive processing steps relative to a preceding one of said successive processing steps; and,
    means for applying fractional sample delay for all said successive processing steps relative to a preceding one of said successive processing steps, if any.

11. The device according to claim 10, wherein the means for applying fractional sample delay is connected between successive processing steps.

12. The device according to claim 10, wherein the means for applying fractional sample delay is integrated within a processing step.

13. The device according to claim 12, wherein the means for applying fractional sample delay is integrated within filters in the processing steps.

14. Peak-to-average ratio reduction device, comprising the device according to claim 10 to produce a digital signal with reduced peak-to-average ratio.

15. Doherty or Chireix type amplification system, comprising the device according to claim 10 as a drain signal generator.

16. Dynamic gate bias amplifier arrangement, comprising the device according to claim 10 as a gate bias signal generator and/or a pre-distorted input signal generator.

17. The arrangement or system according to claim 16, further comprising means for applying fractional sample delay on a reference signal.

18. Amplification system, comprising the device according to claim 10 as a supply voltage generator.

* * * * *